United States Patent
Kim et al.

(10) Patent No.: US 8,343,831 B2
(45) Date of Patent: Jan. 1, 2013

(54) SEMICONDUCTOR DEVICE AND METHOD OF MANUFACTURING THE SEMICONDUCTOR DEVICE

(75) Inventors: Kang-Uk Kim, Seoul (KR); Jae-Man Yoon, Hwaseong-si (KR); Yong-Chul Oh, Suwon-si (KR); Hui-Jung Kim, Seoul (KR); Hyun-Woo Chung, Seoul (KR); Hyun-Gi Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 86 days.

(21) Appl. No.: 13/064,628

(22) Filed: Apr. 5, 2011

(65) Prior Publication Data

US 2011/0183483 A1 Jul. 28, 2011

Related U.S. Application Data

(62) Division of application No. 12/458,262, filed on Jul. 7, 2009, now Pat. No. 7,943,978.

(30) Foreign Application Priority Data

Jul. 7, 2008 (KR) .................. 10-2008-0065402

(51) Int. Cl.
*H01L 29/94* (2006.01)
(52) U.S. Cl. ............... 438/253; 438/238; 438/239
(58) Field of Classification Search .......... 438/253, 438/238, 239; 257/296, 307, E29.345
See application file for complete search history.

(56) References Cited

U.S. PATENT DOCUMENTS

| | | | |
|---|---|---|---|
| 5,888,863 A * | 3/1999 | Tseng ........................ | 438/253 |
| 6,093,614 A | 7/2000 | Gruening et al. | |
| 6,200,855 B1 * | 3/2001 | Lee ........................... | 438/255 |
| 6,238,961 B1 * | 5/2001 | Asano et al. .............. | 438/197 |
| 6,461,957 B1 | 10/2002 | Yokoyama et al. | |
| 6,696,713 B2 | 2/2004 | Ishibashi | |
| 6,707,706 B2 | 3/2004 | Nitayama et al. | |
| 6,949,429 B2 * | 9/2005 | Kim et al. ................. | 438/253 |
| 6,965,139 B2 | 11/2005 | Ohno | |
| 7,153,740 B2 | 12/2006 | Kim et al. | |
| 7,229,895 B2 * | 6/2007 | Wells ......................... | 438/424 |
| 7,241,655 B2 | 7/2007 | Tang et al. | |

(Continued)

FOREIGN PATENT DOCUMENTS

JP 05-121691 5/1993
(Continued)

*Primary Examiner* — Eugene Lee
(74) *Attorney, Agent, or Firm* — Harness, Dickey & Pierce, P.L.C.

(57) ABSTRACT

In a semiconductor device, the semiconductor device may include a first active structure, a first gate insulation layer, a first gate electrode, a first impurity region, a second impurity region and a contact structure. The first active structure may include a first lower pattern in a first region of a substrate and a first upper pattern on the first lower pattern. The first gate insulation layer may be formed on a sidewall of the first upper pattern. The first gate electrode may be formed on the first gate insulation layer. The first impurity region may be formed in the first lower pattern. The second impurity region may be formed in the first upper pattern. The contact structure may surround an upper surface and an upper sidewall of the first upper pattern including the second impurity region. Accordingly, the contact resistance between the contact structure and the second impurity region may be decreased and structural stability of the contact structure may be improved.

10 Claims, 8 Drawing Sheets

U.S. PATENT DOCUMENTS

| | | |
|---|---|---|
| 7,372,091 B2 | 5/2008 | Leslie |
| 7,402,871 B2 * | 7/2008 | Song ............................. 257/379 |
| 7,696,567 B2 | 4/2010 | Haller et al. |
| 7,872,301 B2 | 1/2011 | Takaishi |
| 2004/0173836 A1 | 9/2004 | Oh et al. |
| 2007/0080385 A1 | 4/2007 | Kim et al. |
| 2012/0064680 A1 * | 3/2012 | Oh et al. ...................... 438/239 |

FOREIGN PATENT DOCUMENTS

| | | |
|---|---|---|
| KR | 10-0675285 | 1/2007 |

* cited by examiner

SEMICONDUCTOR DEVICE AND METHOD OF MANUFACTURING THE SEMICONDUCTOR DEVICE

PRIORITY STATEMENT

This application is a divisional of application Ser. No. 12/458,262 filed Jul. 7, 2009, now U.S. Pat. No. 7,943,978, which claims priority under U.S.C. §119 to Korean Patent Application No. 10-2008-65402, filed on Jul. 7, 2008, in the Korean Intellectual Property Office (KIPO), the entire contents of each of which are incorporated herein by reference.

BACKGROUND

1. Field

Example embodiments relate to a semiconductor device and a method of manufacturing a semiconductor device. More particularly, example embodiments relate to a semiconductor device including a transistor having a vertical channel region and a method of manufacturing the same.

2. Description of the Related Art

Generally, transistors included in semiconductor memory devices have a source region for supplying electrons or holes, a drain region for consuming those electrons or holes, and a gate electrode for controlling a flow of the electrons or the holes. A passing region of the electrons or holes from the source region to the drain region may be called a channel region. An insulation layer may be further provided in the transistor to electrically insulate the gate electrode and the channel region.

A gate structure of a conventional transistor may include a stacked structure of a gate insulation layer and a gate electrode. In addition, source and drain regions may be formed in portions of a substrate adjacent to both sides of the gate electrode. Such a transistor has a channel region formed along a horizontal direction to the substrate.

As semiconductor memory devices become highly integrated, a length of a gate electrode of a transistor included in the semiconductor memory device may be decreased rapidly. As the length of the gate electrode may be reduced, problems, e.g., short channel effects, arise in the transistor. Substantially, the short channel effect may be a common name for several problems generated in a transistor, and may include typical problems, e.g., an increase in a leakage current, a decrease in a breakdown voltage, and a continuous increase of a current due to a drain voltage.

Recently, as degrees of integration of a semiconductor memory device become a giga bite, a development of a transistor having a design rule below a current exposure threshold value may be newly required. As a result, a transistor having a horizontal channel region defined by the source and drain regions in the same plane may have difficulties in application to a currently highly integrated semiconductor memory device. Accordingly, a transistor having a vertical channel region defined by source and drain regions formed in a vertical direction with respect to a substrate has been developed. The transistor having a vertical channel region may include a lower active structure provided on a substrate, an upper active structure provided on the lower active structure, an gate insulation layer surrounding the upper active structure, a gate electrode formed on the gate insulation layer and impurity regions formed on upper and lower portions of the gate electrode.

The impurity regions of the vertical channel transistor may be electrically connected to a wiring or a capacitor. Generally, the wiring or the capacitor may be electrically connected to the impurity regions through a contact. Because the contact connects the wiring or the capacitor to the impurity regions, the contact may be required to have a relatively low resistance. Accordingly, the contact may be formed mainly using metal. However, during a sequential process, as metal atoms included in the contact may be diffused to the impurity region, the resistance of the contact may be increased. To prevent or reduce diffusions of the metal atoms from the contact to the impurity regions, a contact formed using polysilicon doped with impurities may be used. However, as the degrees of integration of a semiconductor memory device may be increased greatly, the contact area between the impurity region and the contact may be decreased. As a result, a problem that the contact resistance between the contact and the impurity region is increased may occur.

SUMMARY

Example embodiments provide a semiconductor device including a contact structure with a relatively low resistance and having improved structural stability. Example embodiments provide a method of manufacturing the semiconductor device including a contact structure with a relatively low resistance and having improved structural stability.

According to example embodiments, there may be provided a semiconductor device including a first active structure, a first gate insulation layer, a first gate electrode, a first impurity region, a second impurity region and a contact structure. The first active structure may include a first lower pattern formed in a first region of a substrate and a first upper pattern formed on the first lower pattern. The first gate insulation layer may be formed on a sidewall of the first upper pattern. The first gate electrode may be formed on the first gate insulation layer. The first impurity region may be formed in the first lower pattern. The second impurity region may be formed in the first upper pattern. The contact structure may surround an upper surface and an upper sidewall of the first upper pattern including the second impurity region.

In example embodiments, the first lower pattern may extend in a first direction and the first upper pattern may protrude from the first lower pattern. The first gate electrode may surround the sidewalls of the first upper pattern, the first gate insulation layer being interposed between the first gate electrode and the first upper pattern, and the first gate electrode may extend in a direction different from the first direction. In example embodiments, the first upper pattern may protrude from the first gate insulation layer, and the contact structure may surround the protruding portion of the first upper pattern in three dimensions. In example embodiments, the semiconductor device may further include a first field insulation layer pattern formed on the substrate to bury the first lower pattern and a lower portion of the first upper pattern.

In example embodiments, the semiconductor device may further include an insulation interlayer formed on the first gate electrode to bury the contact structure. The contact structure may protrude from the insulation interlayer. The semiconductor device may further include a capacitor including a lower electrode may be connected to the protruding portion of the contact structure, a dielectric layer on the lower electrode and an upper electrode on the dielectric layer.

In example embodiments, the semiconductor device may further include a second active structure, a second gate insulation layer, a second gate electrode, a third impurity region and a fourth impurity region. The second active structure may include a second lower pattern formed in a second region of the substrate and a second upper pattern formed on the second lower pattern. The second gate insulation layer may be formed on the second upper pattern. The second gate electrode may be formed on the second gate insulation layer. The third impurity region and the fourth impurity region may be formed in the second upper pattern and adjacent to the second gate electrode. The semiconductor device may further include a second field insulation layer pattern burying the second active structure, an upper surface of the second upper pattern being exposed.

According to example embodiments, there may be provided a method of manufacturing a semiconductor device. In the method of manufacturing the semiconductor device, a first active structure may be formed in a first region of a substrate. The first active structure may include a first lower pattern and a first upper pattern in the first region. A first impurity region may be formed in the first lower pattern. A first gate insulation layer may be formed on sidewall of the first upper pattern. A first gate electrode may be formed on the first gate insulation layer. A second impurity region may be formed in the first upper pattern. A contact structure may be formed to surround an upper surface and an upper sidewall of the first upper pattern including the second impurity region.

In example embodiments, in the method of forming the first active structure, a first mask may be formed on the substrate. The substrate may be partially etched using the first mask as an etching mask to form the first upper pattern. A second mask may be formed on sidewall of the first upper pattern. The substrate may be partially etched using the second mask as an etching mask to form the first lower pattern. A preliminary first impurity region may be formed in the substrate adjacent to the first upper pattern, after forming the first upper pattern. The preliminary first impurity region may be partially etched to form the first impurity region during forming the first lower pattern. A first field insulation layer pattern may be further formed to bury the first lower pattern and a lower portion of the first upper pattern.

In example embodiments, in the method of forming the contact structure, an insulation interlayer may be formed on the first gate electrode and the first upper pattern. The insulation interlayer may be etched to form an opening in the insulation interlayer, the opening having a width greater than a width of the first upper pattern. A conductive layer may be formed on the insulation interlayer to fill the opening. The conductive layer may be partially removed until an upper surface of the insulation interlayer is exposed to form the contact structure.

In example embodiments, a lower electrode may be formed to be connected to the contact structure. A dielectric layer may be formed on the lower electrode. An upper electrode may be formed on the dielectric layer.

In example embodiments, a second active structure may be formed in a second region of a substrate. The second active structure may include a second lower pattern and a second upper pattern provided in the second region. A second gate insulation layer may be formed on the second upper pattern. A second gate electrode may be formed on the second gate insulation layer. A third impurity region and a fourth impurity region may be formed in the second upper pattern adjacent to the second gate electrode. A second field insulation layer pattern may be further formed to bury the second active structure, an upper surface of the second upper pattern being exposed.

According to example embodiments, a contact structure surrounding the second impurity region of the first transistor in three dimensions may be provided. Thus, a contact area between the second impurity region and the contact structure may be increased and a contact resistance therebetween may be decreased. Because the contact structure may be formed as a self-alignment manner in the opening in the first insulation interlayer, the contact structure may be formed at a desired position on the second impurity region. Thus, electrical properties and reliability of the semiconductor device including the contact structure may be improved.

Because the contact structure electrically contact to the second impurity region makes contact with the second impurity region in 3-dimensions, the contact resistance between the contact structure and the second impurity region may be decreased. After forming the opening in the insulation interlayer, the conductive layer may be deposited in the opening to form the contact structure. As a result, misalignment problems may be prevented or reduced from occurring between the contact structure and the second impurity region.

BRIEF DESCRIPTION OF THE DRAWINGS

Example embodiments will be more clearly understood from the following detailed description taken in conjunction with the accompanying drawings. FIGS. 1-16 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Various example embodiments will be described more fully hereinafter with reference to the accompanying drawings, in which some example embodiments may be illustrated. Example embodiments may, however, be embodied in many different forms and should not be construed as limited to the example embodiments set forth herein. Rather, these example embodiments may be provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
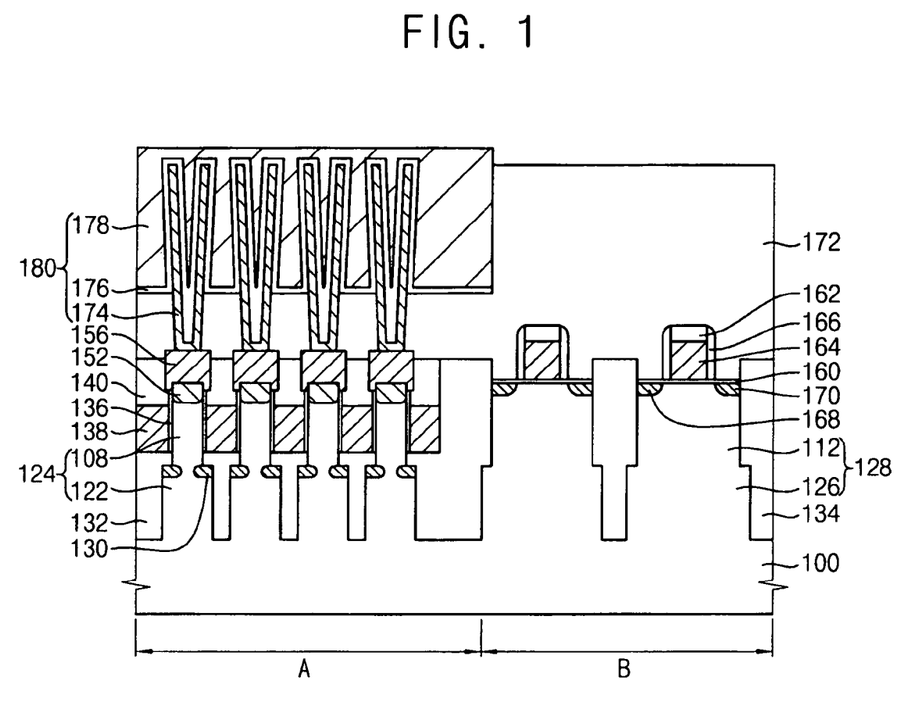
FIG. 1 is a cross-sectional view illustrating a semiconductor device in accordance with example embodiments.

FIG. 1 is a cross-sectional view illustrating a semiconductor device in accordance with example embodiments. Referring to FIG. 1, the semiconductor device may include a substrate 100 having first and second regions A and B, respectively, a first transistor disposed in the first region A, a second transistor disposed in the second region B, a contact structure 156 electrically connected to the first transistor, and a capacitor 180 connected to the contact structure 156.

The substrate may include a semiconductor substrate, e.g., a silicon (Si) substrate and/or a germanium (Ge) substrate. The substrate 100 may include a silicon-on-insulator (SOI) substrate or a germanium-on-insulator (GOI) substrate. The substrate 200 may include the first region A having a cell region including memory cells disposed thereon and the second region B having a peripheral region for logic cells to be formed.

A first active structure 124 and a second active structure 128 may be provided on the substrate 100. The first active structure 124 may be located in the first region A of the substrate 100. The second active structure 128 may be located in the second region B of the substrate 100. The first and second active structures 124 and 128 may include the same material as the substrate 100. For example, the first and second active structures 124 and 128 may include silicon or germanium.

In example embodiments, the first active structure 124 may include a first lower pattern 122 and a first upper pattern 108. The first lower pattern 122 may extend in a first direction in the first region A, and the first upper pattern 108 may protrude from the lower pattern 122 upwardly with respect to the substrate 100. The first upper pattern 108 may have a cylindrical structure or a polygonal pillar structure, e.g., a square pillar.

The second active structure 128 may include a second lower pattern 126 and a second upper pattern 112. The second lower pattern 126 may extend in a direction substantially parallel with the first direction where the first lower pattern 122 extends. The second upper pattern 112 may protrude from the second lower pattern 126 upwardly with respect to the substrate 100 and may extend in a direction substantially parallel with the first direction.

In example embodiments, the second lower pattern 126 may have a width greater than a width of the first lower pattern 122 and the second upper pattern 112 may have a width greater than a width of the first upper pattern 108. The first lower pattern 112 and the second lower pattern 126 may have widths greater than the first upper pattern 108 and the second upper pattern 112, respectively.

The first field insulation layer pattern 132 may be disposed in the first region A of the substrate 100 to partially bury the first active structure 124. The second field insulation layer pattern 134 may be disposed in the second region B of the substrate 100 to cover the second active structure 128. Each of the first and second field insulation layer patterns 132 and 134 may be formed using an oxide, e.g., silicon oxide. For example, the first and second field insulation layer pattern 132, 134 may be composed of USG, BPSG, PSG, FOX, PE-TEOS, TOSZ, FSG, SOG and/or HDP-CVD oxide.

The first field insulation layer pattern 132 may cover the first lower pattern 122 of the first active structure 124 and lower portions of the first upper pattern 108. Therefore, the first field insulation layer pattern 132 may be substantially higher than the first lower pattern 122 but may be lower than the first upper pattern 108. The second field insulation layer pattern 134 may expose an upper surface of the second upper pattern 112 of the second active structure 128. For example, the second active structure 134 may have substantially the same height as the upper surface of the second upper pattern 112.

The first transistor may include a first gate insulation layer 136, a first gate electrode 138, a first impurity region 130 and the second impurity region 152. The first gate insulation layer 136 may be formed on the first upper pattern 108 of the first active structure 124. For example, the first gate insulation layer 136 may be formed surrounding a sidewall of the upper pattern 108 exposed by the first field insulation layer pattern 132. Thus, the first gate insulation layer 136 may be spaced apart from the first lower pattern 122 by a predetermined or given distance. The first gate insulation layer 136 may include silicon oxide or metal oxide. For example, the first gate insulation layer 136 may be formed using a metal oxide, e.g., aluminum oxide (AlOx), hafnium oxide (HfOx), zirconium oxide (ZrOx) and/or tantalum oxide (TaOx).

The first gate electrode 138 may be located on the first gate insulation layer 136. For example, the first gate electrode 138 may be formed surrounding the sidewalls of the upper pattern 108, the first gate insulation layer 136 being interposed between the first gate electrode 138 and the first upper pattern 108. The first gate electrode 138 may be formed using polysilicon doped with impurities, metal and/or a metal compound. For example, the first gate electrode 138 may be formed using tungsten (W), titanium (Ti), aluminum (Al), tantalum (Ta), tungsten nitride (WNx), titanium nitride (TiNx), aluminum nitride (AlNx), tantalum nitride (TaNx), tungsten silicide (WNx), titanium silicide (TiSix) and/or cobalt silicide (CoSix). These may be used alone or in a mixture thereof. The first gate electrode 138 may have as a mono-layer structure including a polysilicon layer, a metal layer, a metal nitride layer or a metal silicide layer. The first gate electrode 138 may have a multi-layer structure including a polysilicon layer, a metal layer, a metal nitride layer, a metal nitride layer and/or a metal silicide layer.

In example embodiments, the first gate electrode 138 may extend in a second direction different from the first direction. For example, the adjacent first gate electrode 138 may be connected to each other in the second direction. The second direction may be substantially perpendicular to the first direction. The first impurity region 130 may be provided in the upper portion of the lower pattern 122 of the first active structure 124. For example, the first impurity region 130 may be formed in a portion of the first lower pattern 122 to be connected to the first upper pattern 108. The first impurity region 130 may extend in a direction substantially parallel with the extending direction of the first lower pattern 122, so that the first impurity region 130 may function as a bit line of the semiconductor device.

The second impurity region 152 may be formed in the first upper pattern 108 of the first active structure 124. Therefore, the first and second impurity regions 130 and 152 may be located in the upper and lower parts along the direction substantially perpendicular with respect to the substrate 100. The first impurity region 130 and the second impurity region 152 may function as a source/drain region of the first transistor respectively.

The second transistor may include a second gate insulation layer 160, a gate mask 162, a second gate electrode 164, a third impurity region 168 and a fourth impurity region 170. The second transistor may be provided on the second active structure 128 located in the second region B of the substrate 100. The second transistor located in the second region B of the substrate 100 may further include a gate spacer 166 provided on sidewalls of the second gate electrode 164 and the gate mask 162.

The second insulation layer 160 may be formed on the second upper pattern 112. The second gate insulation layer 160 may include a silicon oxide or a metal oxide. The second insulation layer 160 may be composed of a metal oxide, e.g., aluminum oxide (AlOx), hafnium oxide (HfOx), zirconium oxide (ZrOx) and/or tantalum oxide (TaOx). The second gate insulation layer 160 may be formed using substantially the same material as the gate insulation layer 136.

The second gate electrode 164 may be provided on the second gate insulation layer 160. The second gate electrode 164 may have a bar structure extending in a direction substantially parallel with the first direction. The second gate electrode 164 may include polysilicon doped with impurities, metal, a metal nitride and/or a metal silicide. For example, the second gate electrode 164 may be formed using tungsten (W), titanium (Ti), tantalum (Ta), aluminum (Al), tungsten nitride (WNx), titanium nitride (TiNx), aluminum nitride (AlNx), tantalum nitride (TaNx), tungsten silicide (WSix), titanium silicide (TiSix) and/or cobalt silicide (CoSix). The second gate electrode 164 may have a mono-layer structure or a multi-layer structure, similar to the first gate electrode 138.

The gate mask 162 may be located on the second gate electrode 164. The gate mask 162 may be formed using a nitride, e.g., silicon nitride or an oxynitride, e.g., silicon oxynitride. The third impurity region 168 and the fourth impurity region 170 may be formed in the second upper pattern 112 adjacent to the second gate electrode 164. For example, the third impurity region 168 and the fourth impurity region 170 may be formed in the second gate electrode adjacent to both sides of the second gate electrode 164, respectively. The third impurity region 168 and the fourth impurity region 170 may function as a source/drain region of the second transistor.

A contact structure 156 may be provided in the first region A of the substrate 100. For example, the contact structure 156 may be located on the first upper pattern 108 of the first active structure 124. The contact structure 156 may have an area substantially greater than that of the first upper pattern 108. In example embodiments, the upper portion of the first upper pattern 108 may protrude slightly from the first field insulation layer pattern 130. Accordingly, the contact structure 156 may be formed covering the second impurity region 152 and surrounding the upper portion of the first upper pattern 108. For example, the contact structure 156 may surround the protruding portion of the first upper pattern in three dimensions. Thus, the contact area between the contact structure 156 and the second impurity region 152 may be increased, to thereby decrease a contact resistance between the contact structure 156 and the second impurity region. Further, structural stability of the contact structure 256 may be improved. The contact structure 156 may be formed using polysilicon doped with impurities, metal and/or a metal compound. For example, the contact structure 156 may be formed using tungsten (W), titanium (Ti), tantalum (Ta), aluminum (Al), tungsten nitride (WNx), titanium nitride (TiNx), aluminum nitride (AlNx) and/or tantalum nitride (TaNx).

A first insulation interlayer 140 may be formed to cover the first upper pattern 108, the first gate electrode 138 and the contact structure 156 in the first region A of the substrate 100. The first insulation interlayer 140 may be formed using an oxide like silicon oxide. For example, the first insulation interlayer may be formed using BPSG, PSG, USG, SOG, FSG, FOX, TEOS and/or HDP-CVD oxide. The first insulation interlayer 140 may include an oxide substantially the same as or different from the first and the second field insulation layer pattern 130, 134. The contact structure 156 may be electrically connected to a capacitor 180 or a wiring (not shown). For example, the capacitor 180 or the wiring (not shown) may be electrically connected to the second impurity region 152 of the first transistor through the contact structure 156.

A second insulation interlayer 172 may be formed on both of the first and second regions A and B. The second insulation interlayer 172 may cover the first insulation interlayer 140, the contact structure 156, the second field insulation layer pattern 134 and the second transistor. The second insulation interlayer 172 may be formed using a silicon oxide, e.g., BPSG, PSG, USG, SOG, FSG, FOX, TEOS and/or HDP-CVD oxide. The second insulation interlayer 140 may include an oxide substantially the same as or different from the first insulation interlayer 140, the first field insulation layer pattern 130 and/or the second field insulation layer pattern 134.

The capacitor 180 may include a lower electrode 174, a dielectric layer 176 and an upper electrode 178. The lower electrode 174 may be connected to the contact structure 156 and partially buried by the second insulation interlayer 172. The dielectric layer 176 and the upper electrode 178 may be successively provided on the lower electrode 174.

The lower electrode 174 and the upper electrode 178 may be formed using polysilicon doped with impurities, metal and/or a metal compound. For example, the lower electrode 174 and the upper electrode 178 may be formed using tungsten (W), aluminum (Al), titanium (Ti), tantalum (Ta), tungsten nitride (WNx), aluminum nitride (AlNx), titanium nitride (TiNx) and/or tantalum nitride (TaNx).

The dielectric layer 176 may be formed using an oxide or a metal oxide. For example, the dielectric layer 176 may be formed using zirconium oxide (ZrOx), aluminum oxide (AlOx), tantalum oxide (TaOx) and/or hafnium oxide (HfOx). In example embodiments, the capacitor 180 may be any of various structures, e.g., a planar structure, a concave structure and/or a cylindrical structure.

In the semiconductor device in accordance with example embodiments, the contact structure 156 may be formed surrounding second impurity region 152 in three dimensions to be connected to the second impurity region 152. Accordingly, the contact area between the contact structure 156 and second impurity region 152 may be increased and structural stability of the contact structure 156 may be improved. Thus, a contact resistance between the contact structure 156 and the second impurity region 152 may be decreased and electrical properties of the semiconductor device may be improved. Further, because the contact structure 156 may be buried in the first insulation interlayer 140 in a self-alignment manner to be connected to the second impurity region 152, an alignment error may be prevented or reduced from occurring between the second impurity region 152 and the contact structure 156.

Figure 2:
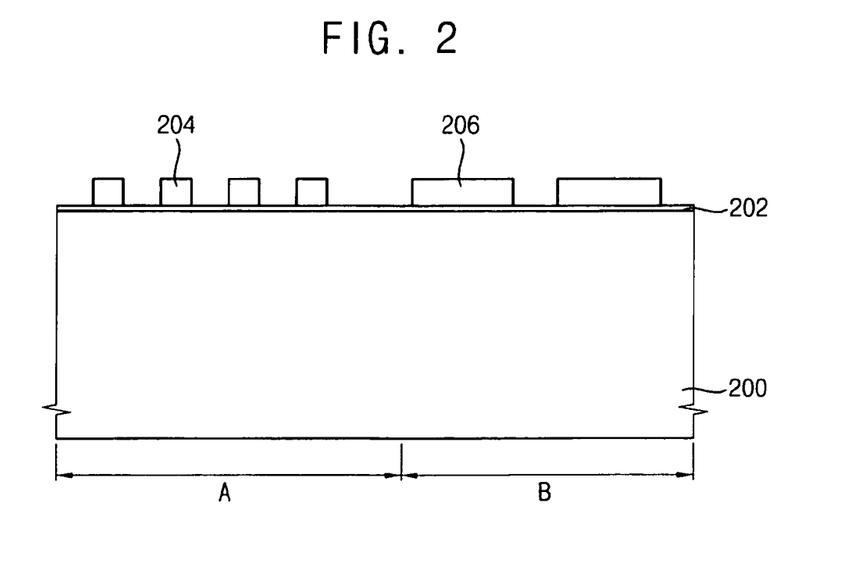
FIGS. 2 to 16 are cross-sectional views illustrating a method of manufacturing a semiconductor device in accordance with example embodiments.

FIGS. 2 to 16 are cross-sectional views illustrating a method of manufacturing a semiconductor device in accordance with example embodiments. Referring to FIG. 2, a pad oxide layer 202 may be formed on a substrate 200. The substrate 200 may include a semiconductor substrate, e.g., a silicon substrate, a germanium substrate. The substrate 200 may include a silicon-on-insulator (SOI) substrate and/or a germanium-on-insulator (GOI) substrate. The substrate 200 may be divided into a first region A for memory cells to be formed and a second region B for logic cells to be formed.

The pad oxide layer may decrease stresses between the substrate 200 and first and second masks 204 and 206. The pad oxide layer 202 may include silicon oxide formed by a thermal oxidation process or a chemical vapor deposition (CVD) process.

The first mask 204 and the second mask 206 may be formed on the pad oxide layer 202. The first mask 204 may be formed in the first region A of the substrate 200, and the second mask 206 may be formed in the second region B of the substrate 200. The first mask 204 may have a cross-sectional feature of a circle or a polygon. The second mask 206 may have a bar structure extending in a first direction on the substrate 200. The first and the second masks 204 and 206 may be formed using silicon nitride or silicon oxynitride.

Figure 3:
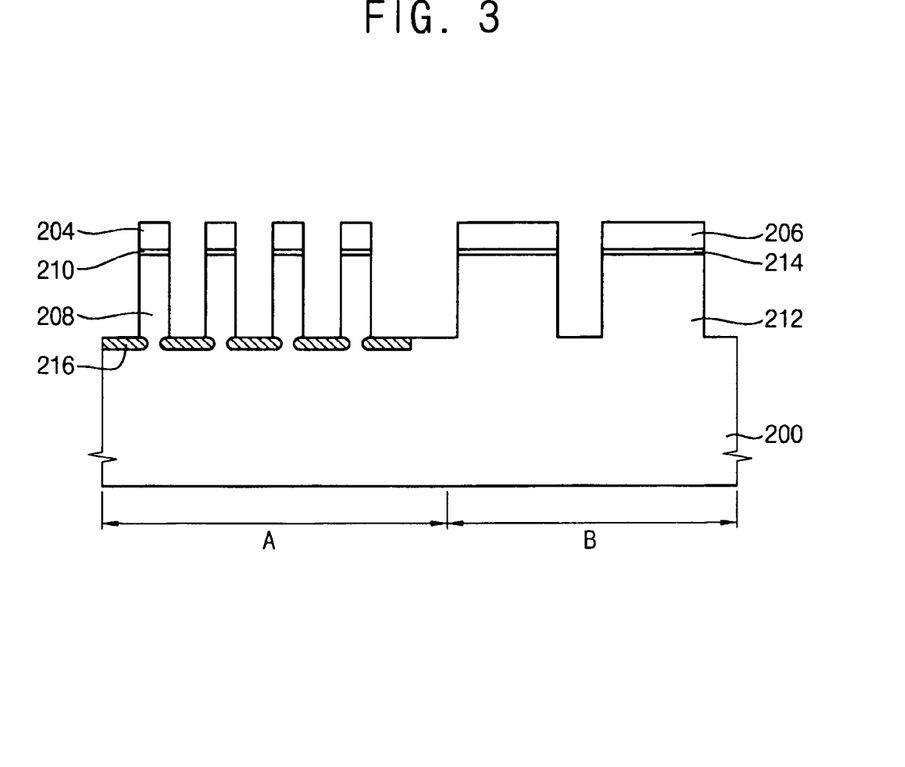

Referring to FIG. 3, the pad oxide layer 202 and the substrate 200 may be partially etched using the first mask 204 and the second mask 206 as etching masks, to form a first pad oxide layer pattern 210 and a first upper pattern 208 in the first region A of the substrate 200 and a second pad oxide layer pattern 214 and a second upper pattern 212 in the second region B of the substrate 200, respectively. For example, the first upper pattern 208 and the second upper pattern 212 may be formed by an anisotropic etch process. In example embodiments, the first upper pattern 208 may have a cylindrical or a polygonal pillar structure according to a cross-sectional feature of the first mask 204. The second upper pattern 212 may have a bar structure extending in a direction substantially parallel with the first according to a feature of the second mask 206. The first upper pattern 212 may have a width substantially greater than a width of the first upper pattern 208.

Impurities may be implanted into the first region A of the substrate 200 adjacent to the first upper pattern 208 to form a preliminary first impurity region 216. The preliminary first impurity region 216 may include p-type impurities or n-type impurities. For example, the preliminary first impurity region 216 may include p-type impurities, e.g., boron (B) and/or indium (In), or n-type impurities, e.g., phosphorus (P) and/or arsenic (As).

Figure 4:
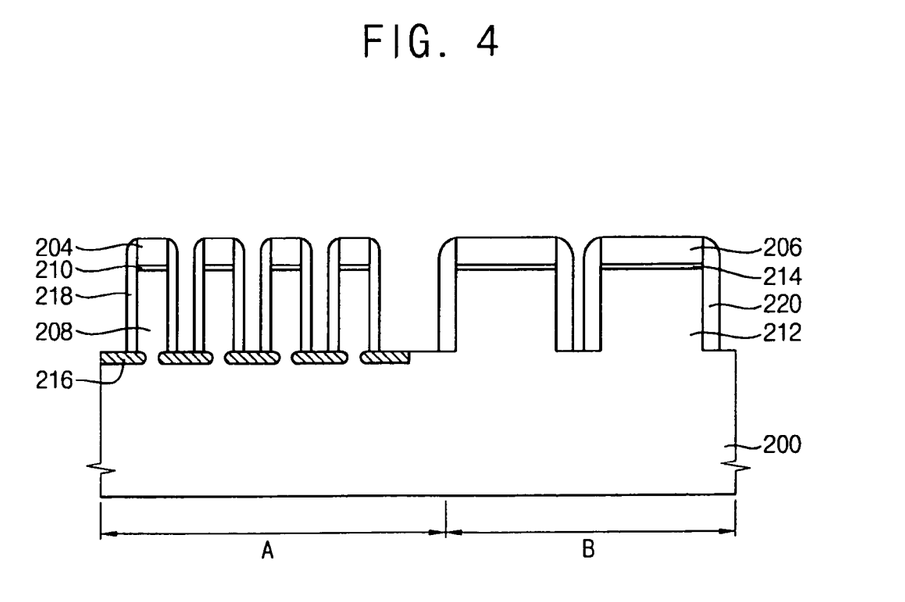

Referring to FIG. 4, a third mask 218 may be formed on sidewalls of the first mask 204 and the first upper pattern 208. The third mask 218 may surround the first upper pattern 208 and may have a bar structure extending in a direction parallel with the first direction. A fourth mask 220 may be formed on sidewalls of the second mask 206 and the second upper pattern 212. The fourth mask 220 may cover the sidewalls of the second upper pattern 212 and may have a bar structure extending in a direction substantially parallel with the first direction. The third and fourth masks 218 and 220 may be formed using a nitride, e.g., silicon nitride, or an oxynitride, e.g., silicon oxynitride.

In example embodiments, after a mask layer (not illustrated) may be formed conformally along with a profile of the first and second masks 204 and 206 and the first and second upper patterns 208 and 212, the mask layer may be etched by an anisotropic etch process, to form the third and fourth masks 218 and 220 surrounding the first and second upper patterns 208 and 212, respectively.

Figure 5:
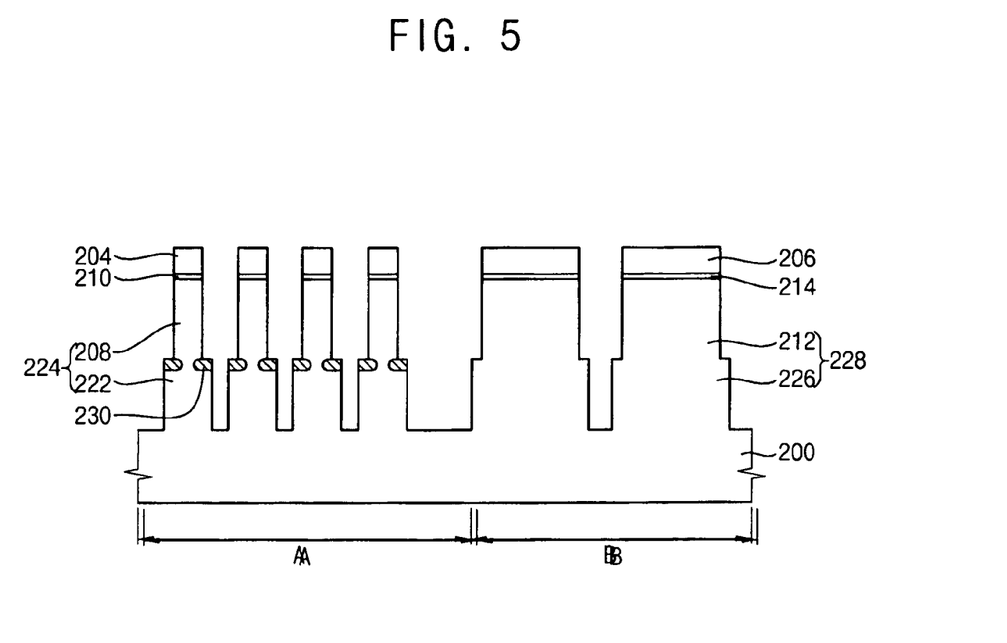

Referring to FIG. 5, the substrate 200 may be etched by an etch process using the first to fourth masks 204, 206, 218 and 220 as etching masks to form a first active structure 224 and a second active structure 228 in the first and the second regions A and B of the substrate 200, respectively.

The first active structure 224 may include the first upper pattern 208 and a first lower pattern 222. The first lower pattern 222 may extend in a direction parallel with the first direction according to a feature of the third mask 218 in the first region A of the substrate 200. The first lower pattern 222 may have a width substantially greater than a width of the first upper pattern 208.

The second active structure 228 may include the second upper pattern 212 and the second lower pattern 226. The second lower pattern 226 may extend in a direction parallel with the first direction according to a feature of the fourth mask 220 in the second region B of the substrate 200. The second lower pattern 226 may have a width substantially greater than a width of the second upper pattern 212. In example embodiments, the second lower pattern 226 may have a width greater than a width of the first lower pattern 222 and the second upper pattern 212 may have a width greater than a width of the first upper pattern 208.

During the etch process for forming the first and second lower patterns 222 and 226, the preliminary first impurity region 216 located in the first region A may be also partially etched. Therefore, a first impurity region 230 may be formed in upper portions of the second lower pattern 222. For example, the first impurity region 230 may be located in portions of the first lower pattern 222 connected to the first upper pattern 208. The first impurity region 230 may function as a source/drain region of a first transistor provided in the first region A. The first impurity region 230 may extend in a direction parallel with for the extending direction of the first lower pattern 222, so that the first impurity region 230 may function as a conductive line, e.g., a bit line of the semiconductor device.

As described above, after forming the first and second active structures 224 and 228 and the first impurity region 230, the third and fourth masks 218 and 220 may be removed from the sidewalls of the first and second upper patterns 208 and 212.

Figure 6:
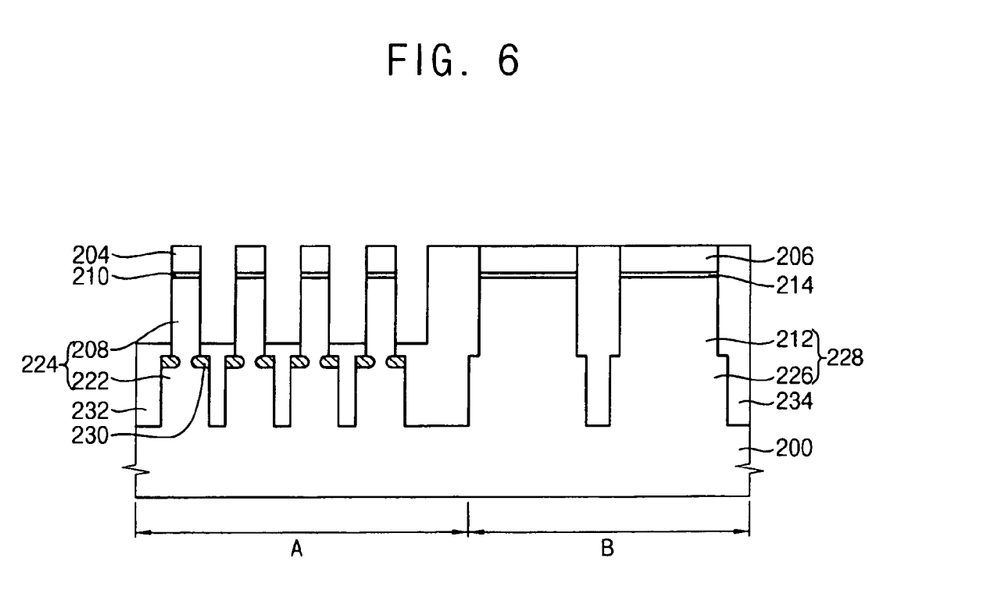

Referring to FIG. 6, a field insulation layer (not illustrated) may be formed to cover the first and second masks 204 and 206 and the first and second active structures 224 and 228. The field insulation layer may be formed using an oxide. For example, the field insulation layer may be formed using a silicon oxide, e.g., USG, BPSG, PSG, FOX, PE-TEOS, TOSZ, FSG, SOG and/or HDP-CVD oxide. The field insulation layer may be formed to sufficiently fill spaces between the adjacent first active structures 224 in the first region A and between the adjacent second active structures 228 in the second region B.

The field insulation layer may be partially removed until upper surfaces of the first and second masks 204 and 206 are exposed, to form a second field insulation layer pattern 234 in the second region B of the substrate 200. The upper surface of the second field insulation layer pattern 234 may be substantially coplanar with the upper surface of the second mask 206.

The field insulation layer located in upper portions of the first region A of the substrate 200 may be partially etched to form a first field insulation layer pattern 232 partially burying the first active structure 224. The upper surface of the first field insulation layer pattern 232 may be lower than the upper surface of the first upper pattern 208 and higher than the upper surface of the first lower pattern 222. Accordingly, the first lower pattern 222 and the lower portion of the first upper pattern 208 may be covered with the first field insulation layer pattern 232. Further, the upper surface of the first field insulation layer pattern 232 may be lower than the upper surface of the second field insulation layer pattern 234.

Figure 7:
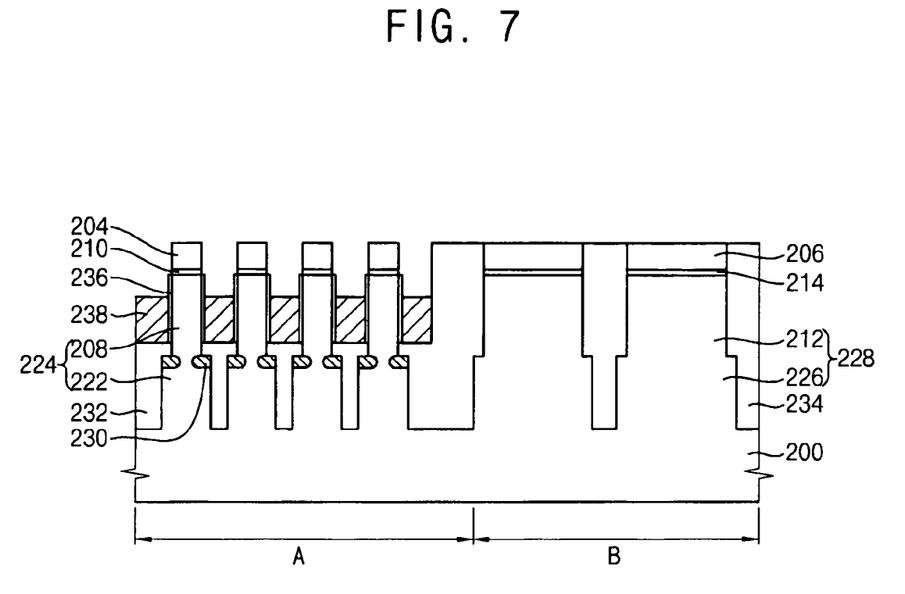

Referring to FIG. 7, a first gate insulation layer 236 may be formed on the first upper pattern 208 of the first active structure 224. The first gate insulation layer 236 may be formed to surround sidewalls of the first upper pattern 208 of the first active structure 224. Because the lower portion of the first upper pattern 208 is surrounded by the first field insulation layer pattern 232, the first gate insulation layer 236 may not be formed on the lower portion of the first upper pattern 208. The first gate insulation layer 236 may be formed using an oxide or a metal oxide. For example, the first gate insulation layer 236 may be formed using silicon oxide (SiOx), zirconium oxide (ZrOx), hafnium oxide (HfOx), tantalum oxide (TaOx), titanium oxide (TiOx) and/or aluminum oxide (AlOx). The first gate insulation layer 236 may be obtained through a thermal oxidation process, a chemical vapor deposition (CVD) process, an atomic layer deposition (ALD) process and/or a sputtering process.

A first conductive layer (not illustrated) may be formed on the first gate insulation layer 236 and on the first field insulation layer pattern 232. The first conductive layer may be formed using polysilicon doped with impurities, metal and/or a metal compound. For example, the first conductive layer may be formed using tungsten (W), titanium (Ti), tantalum (Ta), aluminum (Al), tungsten nitride (WNx), titanium nitride (TiNx), aluminum nitride (AlNx), tantalum nitride (TaNx), tungsten silicide (WSix), titanium silicide (TiSix), cobalt silicide (CoSix) and/or tantalum silicide (TaSix). The first conductive layer may have a single-layer structure or a multi-layer structure.

A fifth mask (not illustrated) may be formed on the first conductive layer. The fifth mask may have a bar structure extending in a second direction substantially different from the first direction. For example, the fifth mask may extend in the second direction substantially perpendicular to the first direction. The fifth mask may be formed using a nitride, e.g., silicon nitride or an oxynitride, e.g., silicon oxynitride.

The first conductive layer may be etched using the fifth mask as an etching mask to form a first gate electrode 238 on the first gate insulation layer 236. The gate electrode 238 may be formed to surround the sidewalls of the first upper pattern 208, the first gate insulation layer 236 being interposed between the first gate electrode 238 and the first upper pattern 208. The first gate electrode 238 may extend in a direction substantially parallel with the second direction according to a feature of the fifth mask. The upper surface of the first gate electrode 238 may be lower than the upper surface of the first upper pattern 208.

As described above, after forming the first gate electrode 238, the fifth mask may be removed from the first gate electrode 238. For example, when the fifth mask may be formed using a nitride, the fifth mask may be removed using an etching solution or etching gas including a phosphoric acid.

Figure 8:
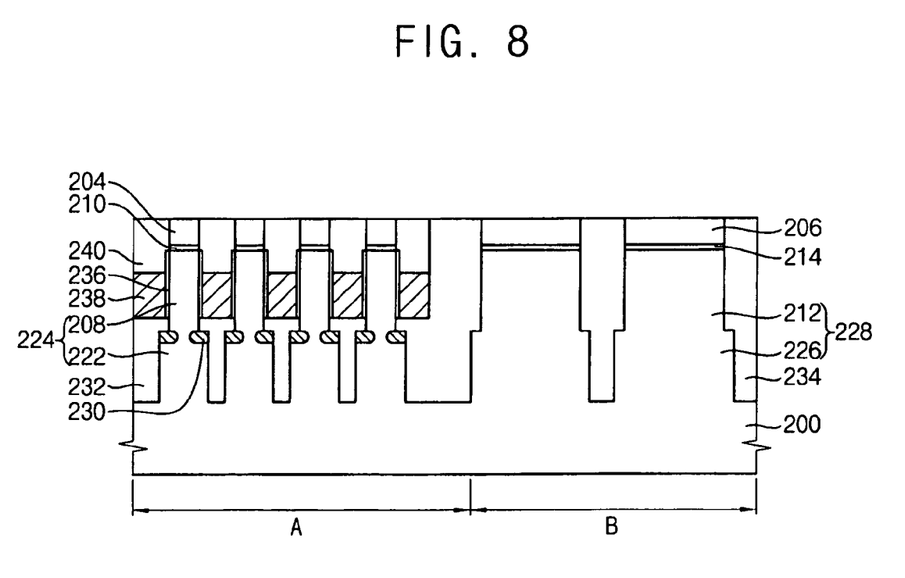

Referring to FIG. 8, a first insulation interlayer 240 may be formed on the first active structure 224, the first mask 204 and the first gate electrode 238. The first insulation interlayer 240 may be formed using an oxide. For example, the first insulation interlayer 240 may be formed using USG, BPSG, PSG, FOX, PE-TEOS, TOSZ, SOG, FSG, and/or HDP-CVD oxide. In example embodiments, the first insulation interlayer 240 may be formed using substantially the same oxide as the first and second field insulation layer patterns 232 and 234. However, the first insulation interlayer 240 may be formed using an oxide different from the first and second field insulation layer patterns 232 and 234.

In example embodiments, an upper surface of the first insulation interlayer 240 may be planarized by partially removing an upper portion of the first insulation interlayer 240 until the first mask 204 may be exposed. For example, the first insulation interlayer 240 may be planarized by a chemical mechanical planarization (CMP) process and/or an etch-back process.

Figure 9:
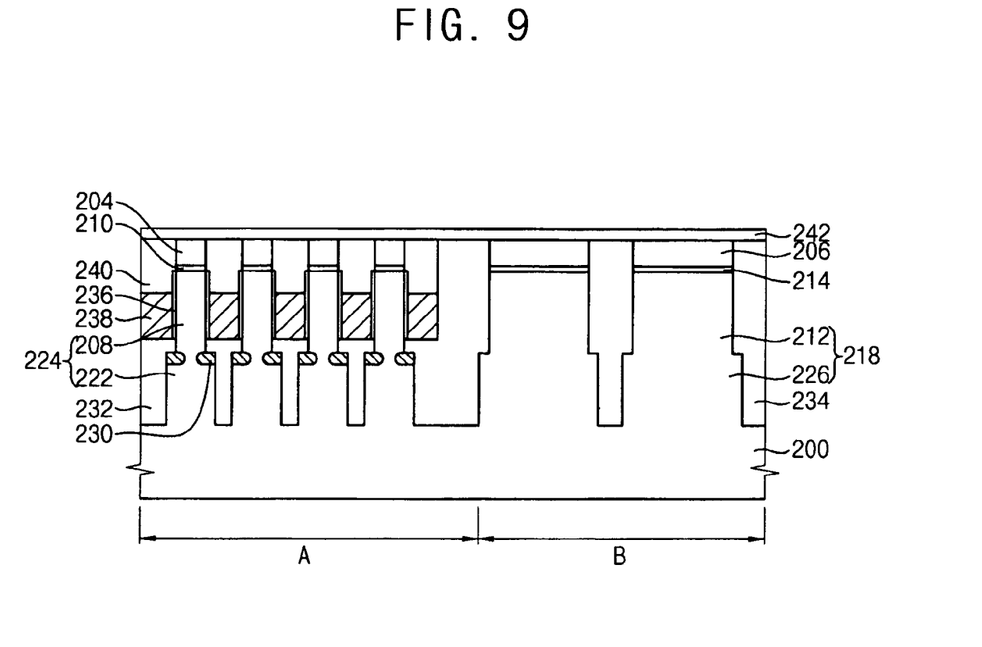

Referring to FIG. 9, a buffer layer 242 may be formed on the first and second masks 204 and 206, the second field insulation layer pattern 234 and the first insulation interlayer 240. For example, the buffer layer 242 may be formed on the whole surface of the first and second regions A and B of the substrate 200. The buffer layer 242 may prevent or reduce the second mask 206 from being etched during a subsequent etch process for removing the first mask 204. The buffer layer 242 may be formed using a material having an etch selectivity with respect to the first mask 204. For example, the buffer layer 242 may be formed using an oxide, e.g., silicon oxide.

Figure 10:
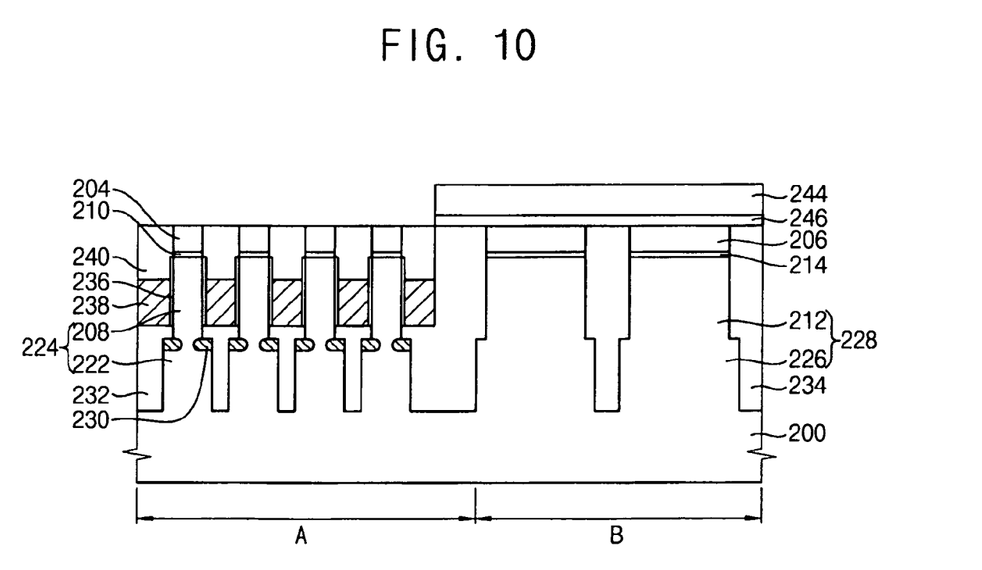

Referring to FIG. 10, a photoresist pattern 244 may be formed on a second portion of the buffer layer 242 in the second region B of the substrate 200. For example, the photoresist pattern 224 may selectively cover the second portion of the buffer layer 224 and may expose a first portion of the buffer layer 242.

The exposed first portion of the buffer layer 242 may be etched using the photoresist pattern 244 as an etching mask to form a buffer layer pattern 246 in the second region B of the substrate 200. Therefore, the buffer layer pattern 246 may protect the second field insulation layer pattern 234 and the second mask 206 in the second region B.

After forming the buffer layer pattern 246, the photoresist pattern 244 may be removed from the buffer layer pattern 246. For example, the photoresist pattern 244 may be removed by an ashing process and/or stripping process. In example embodiments, the thickness of the photoresist pattern 244 may be controlled such that the photoresist pattern 244 may be consumed while the buffer layer pattern 246 is formed.

Figure 11:
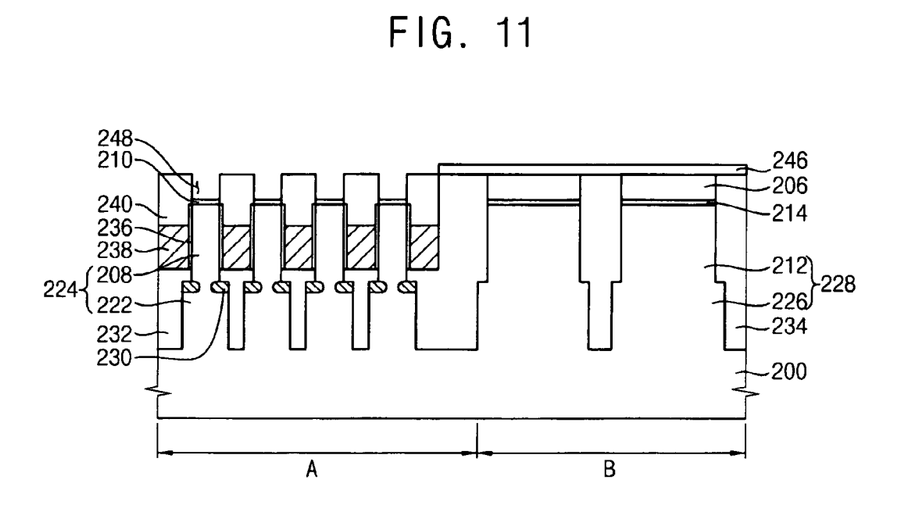

Referring to FIG. 11, the first mask 204 may be removed from the first pad oxide layer pattern 210 located on the first upper pattern 208 to form a first opening 248 exposing the first pad oxide layer pattern 210. The first opening 248 may have a width substantially the same as a width of the first upper pattern 208. Because the second mask 206 may be protected by the buffer layer pattern 246, the second mask 206 may not be etched during the etch process for forming the first opening 248. Because the first opening 248 may be formed by removing the first mask 204, the first opening 248 may have a depth substantially the same as a depth of the first mask 204. When the first opening 248 is formed, the first field insulation layer pattern 240 protrudes from the first pad oxide layer pattern 210.

Figure 12:
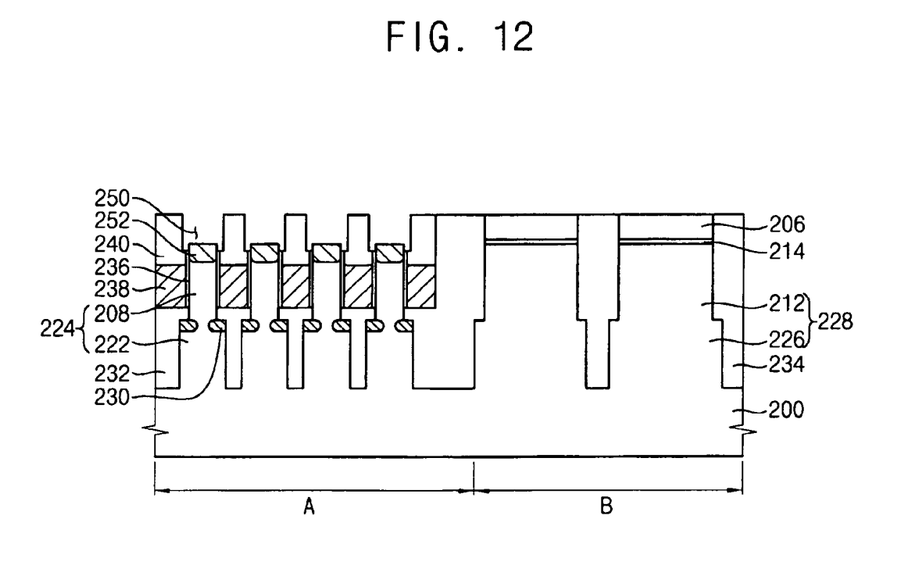

Referring to FIG. 12, the first pad oxide layer pattern 210 may be removed from the first upper pattern 208 to form a second opening 250 exposing the first upper pattern 208. For example, the second opening 250 may have a depth greater than a depth of the first opening 248. When the first insulation interlayer 240 includes an oxide, the first insulation interlayer 240 may be partially etched while the first pad oxide layer pattern 210 is removed. Therefore, the second opening 250 may have a width greater than a width of the first opening 248. The second opening 250 may expose the upper surface and a portion of the sidewall of the first upper pattern 208 of the first active structure 224.

The buffer layer pattern 246 may be removed together while the first pad oxidation layer pattern 210 may be removed to form the second opening 250. For example, when the buffer layer pattern 246 includes an oxide, the buffer layer pattern 246 may be removed together with the first pad oxide layer pattern 210 including an oxide. In example embodiments, the first pad oxide layer pattern 210 may be removed, and the buffer layer 268 of the second region B may be removed additionally.

Impurities may be implanted into the upper portion of the first upper pattern 208 to form the second impurity region 252. The second impurity region 252 may include p-type impurities or n-type impurities. For example, the second impurity region may include p-type impurities, e.g., boron (B) and/or indium (In), or n-type impurities, e.g., phosphorus (P) and/or arsenic (As).

Figure 13:
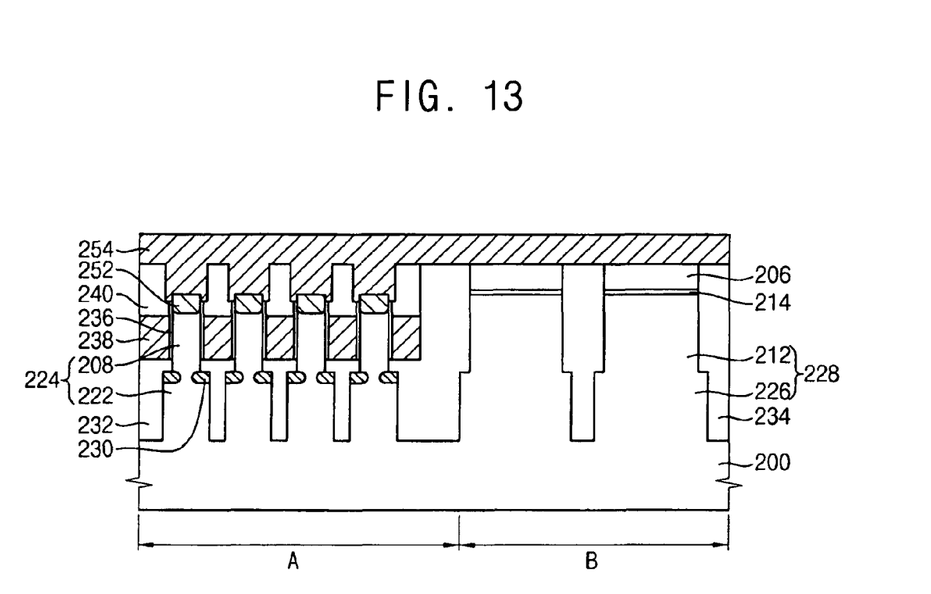

Referring to FIG. 13, a second conductive layer 254 may be formed on the first insulation interlayer 240, the second impurity region 252, the second field insulation layer pattern 234 and the second mask 206 to fill the second opening 250. For example, the second conductive layer 254 may be formed on the whole region of the first and second regions A and B. The second conductive layer 254 may be formed using polysilicon doped with impurities, metal and/or a metal compound. For example, the second conductive layer 254 may be formed using titanium (Ti), tantalum (Ta), tungsten (W), aluminum (Al), tungsten nitride (WNx), titanium nitride (TiNx), aluminum nitride (AlNx), titanium silicide (TiSix), tantalum silicide (TaSix), cobalt silicide (CoSix), and/or tungsten silicide (WSix). These may be used alone or in a mixture thereof. The second conductive layer 254 may be formed as a single-layer structure or a multi-layer structure.

Figure 14:
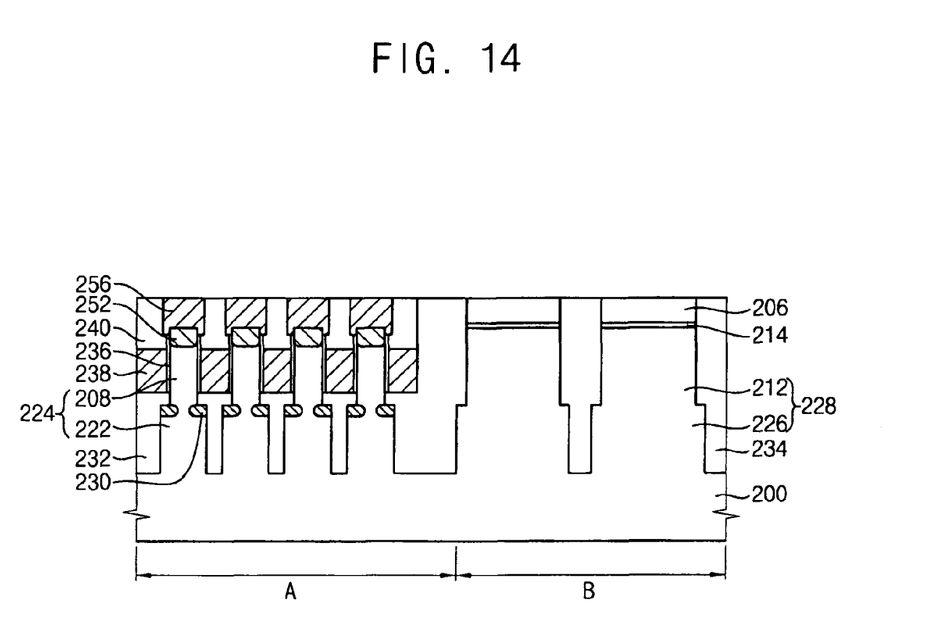

Referring to FIG. 14, the second conductive layer 254 may be partially removed until the first insulation interlayer 240, the second mask 206 and the second field insulation layer pattern 234 are exposed, to form a contact structure 256 on the first active structure 224. The contact structure 256 may be formed by a chemical mechanical planarization (CMP) process and/or an etch-back process. The contact structure 256 may be connected to the second impurity region 252 of the first active structure 224. For example, the contact structure 256 may be electrically connected to the second impurity region.

In example embodiments, because the contact structure 256 is formed by filling the second opening 250 with the second conductive layer 254, and partially etching the second conductive layer 254, the contact structure 256 may be formed in a self-alignment manner due to the second opening 250 exposing the second impurity region 252. As a result, misalignment problems may be prevented or reduced from occurring between the contact structure 256 and the second impurity region 252. The contact structure 256 may be formed to be connected to not only the upper surface of the upper pattern 208, but also the sidewalls of the upper pattern 208. For example, the contact structure may surround the upper portions of the upper pattern 208. Therefore, the contact area between the contact structure 256 and the second impurity region 252 may be increased, thereby decreasing a contact resistance therebetween.

Figure 15:
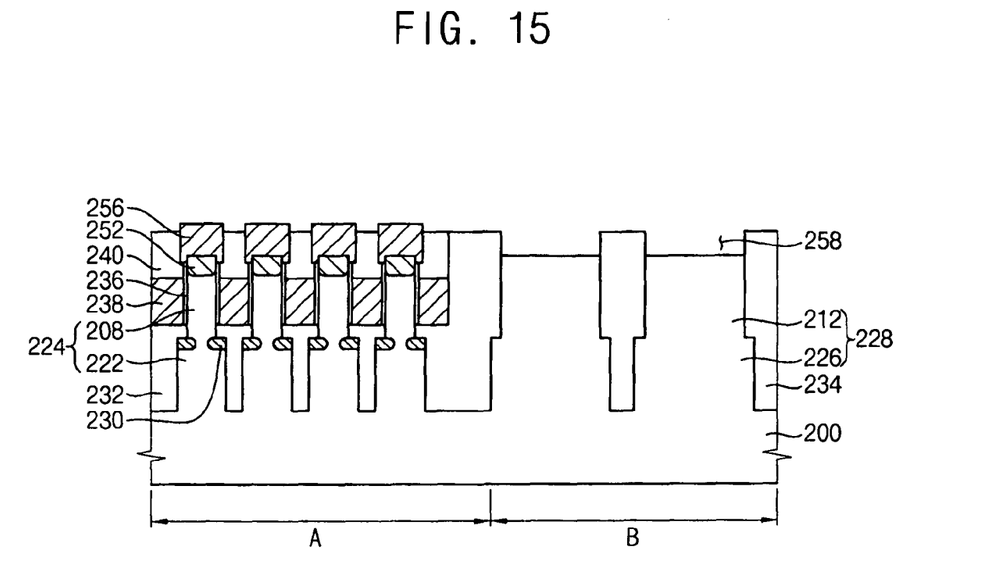

Referring to the FIG. 15, the second mask 206 and the second pad oxide layer pattern 214 may be removed to form a third opening 258 exposing the second upper pattern 212. Because the third opening 258 is formed by removing the second mask 206 and the second pad oxide layer pattern 214, the third opening 258 may have a depth substantially the same as the whole depth of the second mask 206 and the second pad oxide layer pattern 214. When the second field insulation layer pattern 234 includes an oxide, the second field insulation layer pattern 234 may be partially etched together while the second pad oxide layer pattern 214 is etched. Therefore, the third opening 258 may have a width substantially greater than a width of the second pad oxide layer pattern 214. Further, the first pad insulation layer pattern 240 including an oxide may be partially etched together while the second pad oxide layer pattern 214 is etched. Accordingly, the contact structure 256 may protrude slightly from the first field insulation layer pattern 240.

Figure 16:
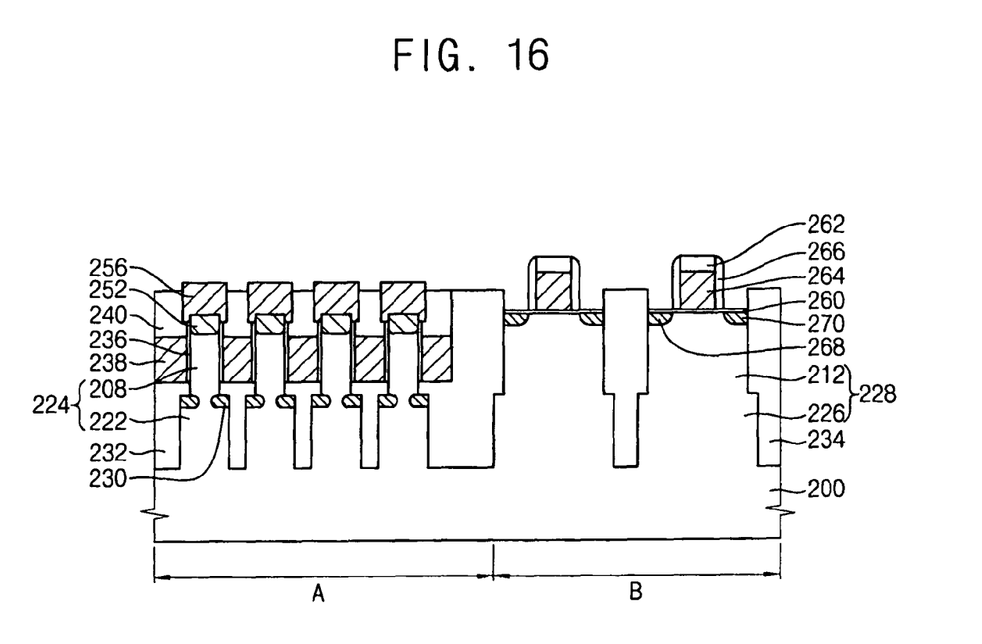

Referring to the FIG. 16, a second transistor may be formed on the first upper pattern 212 of the second active structure 228. The second transistor may include a second gate insulation layer 260, a second gate electrode 264, a gate mask 262, a third impurity region 268 and a fourth impurity region 270. The second transistor located in the second region B of the substrate 200 may further include a gate spacer 266 provided on sidewalls of the second gate electrode 264 and the gate mask 262.

In example embodiments, after forming the gate insulation layer 260 on the second upper pattern 212 of the second active structure 228, a third conductive layer (not illustrated) and the gate mask 262 may be formed on the second gate insulation layer 260 successively. The third conductive layer may be etched using the gate mask 262 as an etching mask to form the gate electrode 264 on the second gate insulation layer 260. Impurities are implanted into the second upper pattern 212 adjacent to the second gate electrode 264 to form the third and fourth impurity regions 268 and 270. The third and fourth impurity regions 268 and 270 may include p-type impurities or n-type impurities. For example, the third and fourth impurity regions 268 and 270 may include boron (B), indium (In), phosphorus (P) and/or arsenic (As).

As illustrated in FIG. 1, a device structure electrically connected to the contact structure 256 may be completed. In example embodiments, the device structure, e.g., a capacitor 180, may be formed in the first region A of the substrate 200.

In processes of forming the above-mentioned capacitor, a second insulation interlayer (not illustrated) may be formed on the contact structure 256, the first insulation interlayer 240, the second transistor and the second field insulation layer pattern 234. The second insulation interlayer may be formed using an oxide, e.g., USG, BPSG, PSG, FOX, PE-TEOS, TOSZ, FSG, SOG and/or HDP-CVD oxide. The second insulation interlayer may be formed using an oxide substantially the same as the first insulation interlayer 240, but may be formed using an oxide different from the first insulation interlayer 240. After forming a seventh mask (not illustrated) on the second insulation interlayer, the second insulation interlayer may be partially etched using the seventh mask as an etching mask to form a fifth opening (not illustrated) exposing the contact structure 256.

A fourth conductive layer (not illustrated) may be formed on the second insulation interlayer, the exposed contact structure 256 and sidewalls of the fifth opening. The fourth conductive layer may be formed using polysilicon doped with impurities, metal and/or a metal compound. A sacrificial layer (not illustrated) may be formed on the second insulation interlayer to completely fill the fifth opening where the fourth conductive layer is formed. The sacrificial layer may be formed using an oxide or a photoresist.

After partially etching the sacrificial layer until the fourth conductive layer is exposed, the exposed fourth conductive layer and the sacrificial layer are partially etched to form a lower electrode 174 on the sidewalls of the fifth opening and on the contact structure 156. After forming the lower electrode 174, the sacrificial layer may be removed. When the sacrificial layer includes an oxide, while the sacrificial layer is removed, the second insulation interlayer may be partially etched to partially the lower electrode 174.

After a dielectric layer (not illustrated) is formed conformally along with a profile of the lower electrode 174 and the second insulation interlayer, an upper electrode may be formed on the dielectric layer to complete the semiconductor device as illustrated in FIG. 1. The capacitor 180 may include the lower electrode 174 connected to the contact structure 156, the dielectric layer formed on the lower electrode 174 and the upper electrode provided on the upper electrode.

The dielectric layer may be formed using an oxide, a nitride and/or a metal oxide. For example, the dielectric layer may be formed using silicon oxide (SiOx), silicon nitride (SiNx), aluminum oxide (AlOx), hafnium oxide (HfOx), and/or zirconium oxide (ZrOx). Also, the upper electrode may be formed using polysilicon doped with impurities, metal and/or a metal compound.

In a method of manufacturing the semiconductor device in accordance with example embodiments, the contact structure 256 may be formed surrounding the upper surface and upper sidewalls of the first upper pattern 208 including the second impurity region 252. Accordingly, the contact area between the second impurity region 252 and the contact structure 256 may be increased and structural stability of the contact structure 256 may be improved. Therefore, electrical properties of the semiconductor device may be improved. Because the contact structure 256 is formed in the opening 250 in the first insulation interlayer 240 in a self-aligned manner, an alignment error may be prevented or reduced from occurring between the second impurity region 252 and the contact structure 256.

As mentioned above, a contact structure surrounding the impurity region in the first region A of the first transistor in three dimensions may be provided. Thus, the contact area between the second impurity region and the contact structure may be increased and a contact resistance therebetween may be decreased. Further, because the contact structure is formed in a self-aligned manner in the opening in the first insulation interlayer, the contact structure may be formed at a desired position on the second impurity region. Thus, electrical properties and reliability of a semiconductor device including the contact structure may be improved.

The foregoing may be illustrative of example embodiments and may be not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it may be to be understood that the foregoing may be illustrative of various example embodiments and may be not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, the method comprising:
    forming a first active structure in a first region of a substrate, the first active structure including a first lower pattern and a first upper pattern in the first region;
    forming a first impurity region in the first lower pattern;
    forming a first gate insulation layer on a sidewall of the first upper pattern;
    forming a first gate electrode on the first gate insulation layer;
    forming a second impurity region in the first upper pattern; and
    forming a contact structure surrounding an upper surface and upper sidewall of the first upper pattern including the second impurity region.

2. The method of claim 1, wherein forming the first active structure comprises
    forming a first mask on the substrate;

partially etching the substrate using the first mask as an etching mask to form the first upper pattern;

forming a second mask on a sidewall of the first upper pattern; and partially etching the substrate using the second mask as an etching mask to form the first lower pattern.

3. The method of claim 2, further comprising:

forming a preliminary first impurity region in the substrate adjacent to the first upper pattern after forming the first upper pattern.

4. The method of claim 3, wherein the preliminary first impurity region is partially etched to form the first impurity region while forming the first lower pattern.

5. The method of claim 1, further comprising:

forming a first field insulation layer pattern to bury the first lower pattern and a lower portion of the first upper pattern.

6. The method of claim 1, wherein forming the contact structure comprises:

forming an insulation interlayer on the first gate electrode and the first upper pattern;

etching the insulation interlayer to form an opening in the insulation interlayer, the opening having a width greater than a width of the first upper pattern;

forming a conductive layer on the insulation interlayer to fill the opening; and partially removing the conductive layer until an upper surface of the insulation interlayer is exposed to form the contact structure.

7. The method of claim 5, wherein the conductive layer comprises at least one selected from the group consisting of polysilicon doped with impurities, metal and metal compound.

8. The method of claim 1, further comprising:

forming a lower electrode connected to the contact structure;

forming a dielectric layer on the lower electrode; and forming an upper electrode on the dielectric layer.

9. The method of claim 5, further comprising:

forming a second active structure in a second region of a substrate, the second active structure including a second lower pattern and a second upper pattern in the second region;

forming a second gate insulation layer on the second upper pattern;

forming a second gate electrode on the second gate insulation layer; and forming a third impurity region and a fourth impurity region in the second upper pattern adjacent to the second gate electrode.

10. The method of claim 9, further comprising:

forming a second field insulation layer pattern to bury the second active structure, an upper surface of the second upper pattern being exposed.

* * * * *